(12) United States Patent
Tang (10) Patent No.: US 6,490,203 B1
(45) Date of Patent: Dec. 3, 2002

(54) SENSING SCHEME OF FLASH EEPROM

(75) Inventor: Yuan Tang, San Jose, CA (US)

(73) Assignee: EDN Silicon Devices, Inc., Santa Clara, CA (US)

( * ) Notice: Subject to any disclaimer, the term of this patent is extended or adjusted under 35 U.S.C. 154(b) by 0 days.

(21) Appl. No.: 09/863,697

(22) Filed: May 24, 2001

(51) Int. Cl.[7] .............................................. G11C 16/04
(52) U.S. Cl. .............................. 365/185.22; 365/185.2; 365/185.29
(58) Field of Search ........................ 365/185.22, 185.2, 365/185.18, 185.3, 185.29, 185.04, 185.24, 207, 210

(56) References Cited

U.S. PATENT DOCUMENTS

| | | | | |
|---|---|---|---|---|
| 5,532,962 A | * | 7/1996 | Auclair et al. ............... | 365/184 |
| 5,579,274 A | * | 11/1996 | Van Buskirk et al. .. | 365/185.12 |
| 5,654,918 A | * | 8/1997 | Hammick ................. | 365/185.2 |
| 5,966,330 A | * | 10/1999 | Tang et al. ............. | 365/185.09 |
| 6,049,899 A | * | 4/2000 | Auclair et al. .............. | 365/184 |
| 6,205,056 B1 | * | 3/2001 | Pan et al. ................. | 365/185.2 |

\* cited by examiner

*Primary Examiner*—David Nelms
*Assistant Examiner*—Thong Le
(74) *Attorney, Agent, or Firm*—Davis Chin (57) ABSTRACT

There is provided a reading circuit and method for performing program verify, erase verify, and over-erase-correction verify modes of operations on a selected memory core cell in an array of Flash EEPROM memory core cells. A fixed control gate bias voltage is applied to the control gate of a core cell transistor whose state is to be verified for generating a core cell drain current. Varied control gate bias voltages are applied to the control gate of a single reference cell transistor for generating different reference currents corresponding to predetermined modes of operations. In a second embodiment, the different reference currents are generated from a current source.

7 Claims, 5 Drawing Sheets

SENSING SCHEME OF FLASH EEPROM

BACKGROUND OF THE INVENTION

1. Field of the Invention

This invention relates generally to non-volatile memory devices having a floating gate. More particularly, the present invention relates to a new and novel reading circuitry and method for performing program verify, erase verify and over-erase-correction verify operations on a selected memory core cell in an array of EPROM, EEPROM, or Flash EEPROM memory core cells which uses only a single reference cell so as to reduce the amount of trimming time required during manufacturing.

2. Description of the Prior Art

As is generally well-known in the art, non-volatile memory devices using a floating gate for the storage of charges thereon such as EPROMs (electrically programmable read-only memories), EEFROMs (electrically, erasable programmable read only memories) or Flash EEPROMs have emerged in recent years. In such a conventional Flash EEPROM memory device, a plurality of such one-transistor memory may be formed on a P-type semiconductor substrate in which each cell is comprised of an n+ drain region and an n+ source region both formed integrally within the substrate. A relatively thin gate dielectric layer is interposed between a top surface of the substrate and a conductive polysilicon floating gate. A polysilicon control gate is insulatively supported above the floating gate by a second dielectric layer. A channel region in the substrate separates the drain and source regions.

As is well-known, the charge of the floating gate of the one-transistor cell is dependent upon the number of electrons contained in the floating gate. During the programming mode, electrons are added to the floating gate of the cell so as to increase its threshold voltage. The term "threshold" refers to a gate-to-source voltage that must be applied between the gate and the source of the cell in order to cause it to conduct. During the erase mode, electrons are removed from the floating gate of the cell so as to decrease its threshold voltage. In programmed state, the threshold voltage of a cell is typically set at greater than +6.5 volts, while the threshold voltage of a cell in an erased state is typically limited below +3.0 volts.

In order to determine whether the cell has been programmed or not, the cell is read by applying a small positive voltage to the control gate between the +3.0 and +6.5 volt range, typically +5.0 volts, with the source region held at a ground potential (0 volts) and the drain held at a potential between +1 to +2 volts. If the transistor cell conducts or is turned-on, a current will flow through the transistor representing a "1" bit or erased state. On the other hand, if the transistor cell does not conduct or is turned-off no current will flow through the transistor representing a "0" bit or programmed state.

Figure 1:
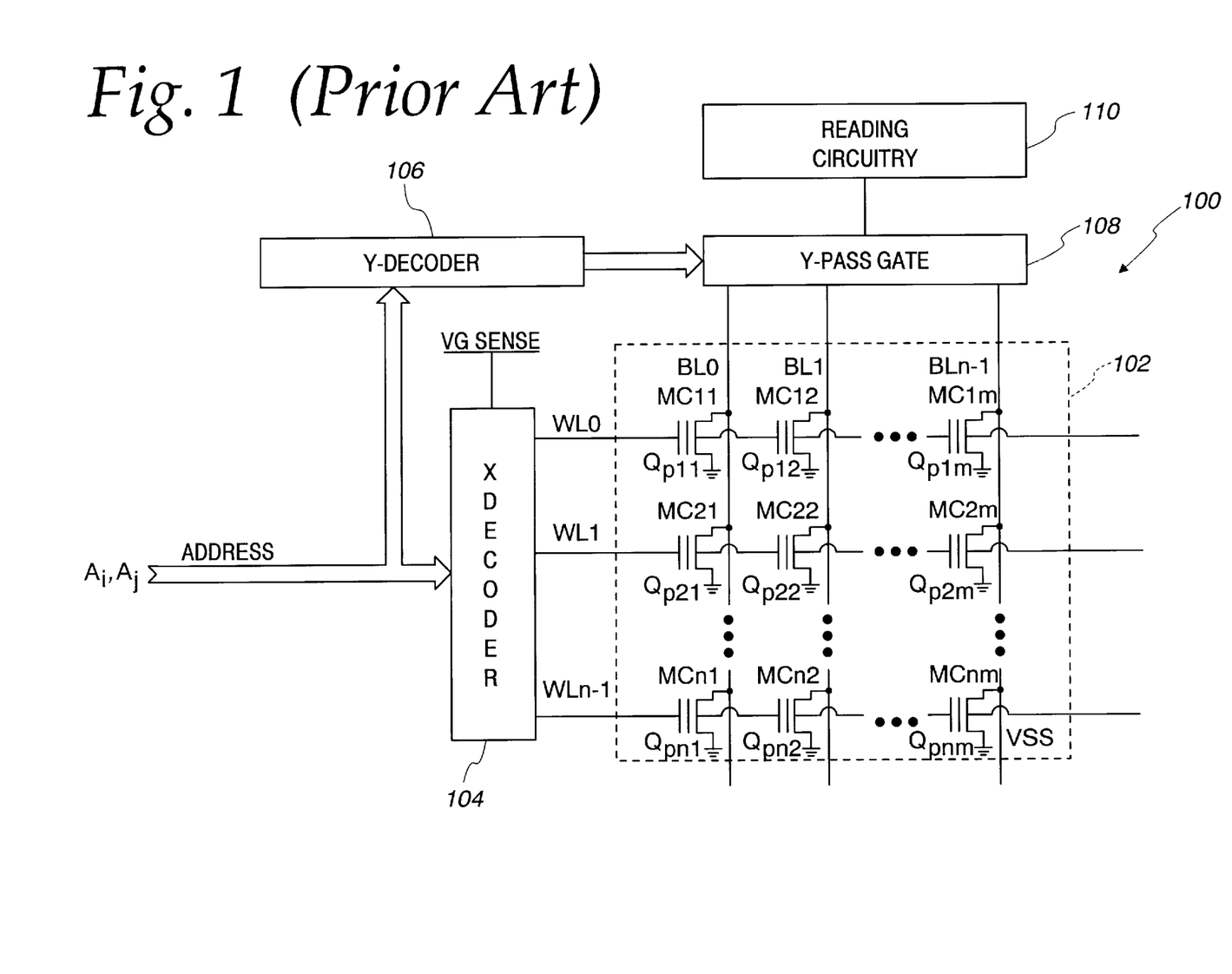
FIG. 1 is a simplified functional block diagram of a conventional semiconductor memory circuit device, including a Flash EEPROM memory array and reading circuitry.

FIG. 1 is a simplified functional block diagram of a conventional semiconductor integrated memory circuit device 100 which includes a Flash EEPROM memory array 102 formed of a plurality of memory core cells MC11–NCnm (each being formed as described above). The plurality of memory cells NC11–MCnm are arranged in an n×m matrix on a single integrated circuit chip. Each of the memory cells is comprised of one of the array core transistors $Q_{P11}$ through $Q_{Pnm}$ which function as a memory transistor for storing data "1" or "0" therein. Each of the core transistors has its drain connected to one of the plurality of bit lines BL0–BLM. All of the sources of the array core transistors are connected to a common array ground potential VSS. Each of the core transistors also has its control gate connected to one of the plurality of word lines WL0–WLN.

The memory circuit device 100 further includes a row address decoder 104, a column address decoder 106, and a Y-pass gate circuit 108. The row address decoder 104 selects one of the corresponding word lines WL0–WLn in the memory core cell array 102 in response to row address signals $A_i$. At the same time, the column decoder 106 selects one of the corresponding bit lines Bl0–BLm in response to column address signals $A_j$. The Y-pass gate circuit 108 connects the corresponding array bit lines to a sensing or reading circuitry 110.

In order to determine the state of a selected memory core cell, the reading circuitry 110 includes a sense amplifier functioning as a comparator which receives a core current signal from a bit line on its one input and receives a reference current signal from a reference line on its other input. In this manner, the core current signal corresponding to a core current is compared with the reference current signal corresponding to a reference current from a reference cell. The result on the output of the comparator indicates whether the selected memory core cell is storing a "1" or "0".

Figure 2:
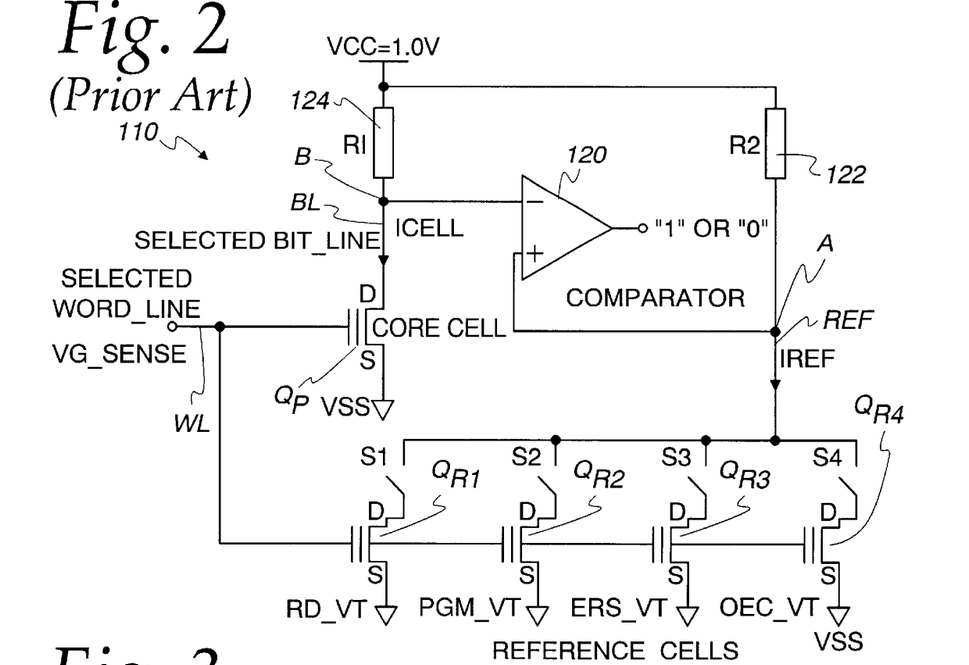
FIG. 2 is a simplified schematic circuit diagram of certain portions of the memory circuit device of FIG. 1.

With reference to FIG. 2 of the drawings, there is shown a simplified schematic circuit diagram of certain portions of the memory circuit device 100 of FIG. 1 to explain how the program verify, erase verify, and over-erase-correction verify states of one selected array core transistor $Q_P$ is determined. In particular, the reading or sensing circuitry 110 of FIG. 2 includes a comparator 120, a reference resistor 122 having a resistance value R2, a sense resistor 124 having a resistance value R1, a core transistor $Q_P$, and a plurality of reference transistors $Q_{R1}$–$Q_{R4}$. The comparator 120 is actually one of the sense amplifiers of FIG. 1.

The reference resistor 122 has its one end connected to a supply potential or voltage VCC, which is typically at +1.0 volts, and its other end connected to the non-inverting input of the comparator 120 at node A. The node A is also coupled to the drains of the reference transistors $Q_{R1}$–$Q_{R4}$ via the reference cell line REF and corresponding switches S1–S4. One end of the sense resistor 124 is also connected to the supply potential VCC, and the other end thereof is connected to the inverting input of the comparator 120 at node B. The node B is also connected to the drain of the core transistor $Q_P$ via the selected bit line BL. As can be seen, the gates of the core transistor $Q_P$ and the reference transistors $Q_{R1}$–$Q_{R4}$ are connected together and receive the same control gate voltage VG_SENSE via the selected word line WL.

During a normal Read mode of operation, in order to read the selected core cell in the memory array, the core current ICELL from the selected core cell $Q_P$ is compared with the reference current IREF from the reference cell $Q_{R1}$ having a read threshold voltage RD_VT by closing the switch S1. During a program verify mode of operation, in order to read the selected core cell in the memory array, the core current ICELL from the selected core cell $Q_P$ is compared with the reference current IREF from the reference cell $Q_{R2}$ having a program verify threshold voltage PGM_VT by closing the switch S2. During an erase-verify mode of operation, in order to read the selected core cell in the memory array, the core current ICELL from the selected core cell $Q_P$ is compared with the reference current IREF from the reference cell $Q_{R3}$ having an erase-verify threshold voltage ERS_VT by closing the switch S3. During an over-erasecorrection mode of operation, in order to read the selected core cell in the memory array, the core current ICELL from the selected core cell $Q_P$ is compared with the reference current IREF from the reference cell $Q_{R4}$ having an over-erase-correction threshold voltage OEC_VT by closing the switch S4.

The various threshold voltages for the four reference cells $Q_{R1}$–$Q_{R4}$ are required to satisfy the following condition:

OEC_VT<ERS_VT<RD_VT<PGM_VT

Figure 3:
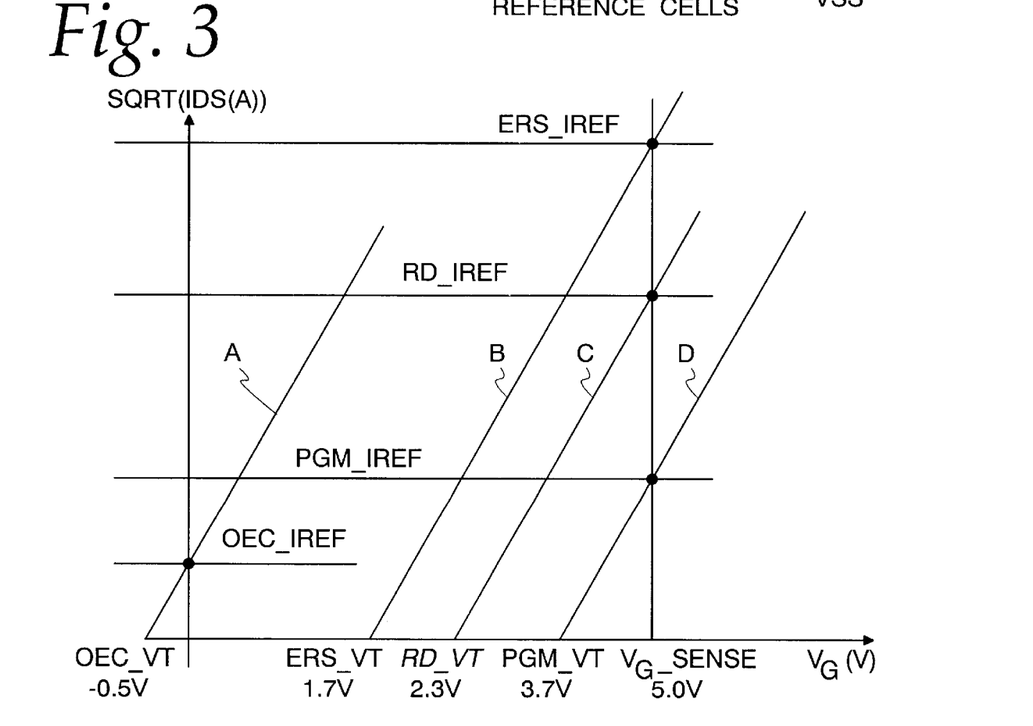
FIG. 3 shows plots of a family of curves representing the current $I_{DS}$ of the four reference cell transistors of FIG. 2 each having a different threshold voltage as a function of control gate bias voltage $V_G$.

As will be noted from FIG. 3, the reference cell current from the four respective reference cells $Q_{R1}$–$Q_{R4}$ (each having a different reference threshold voltage) are plotted as a function of the control gate bias $V_G$ applied to the respective reference cells. Since the reference cells are identical to the array core cells, the plotted IDS curves A–D are parallel to each other and are also parallel to the IDS curve of an array core cell. Thus, the plotted curves A–D are only separated from one another by the differences in values of the their threshold voltages.

In order to determine whether the selected core cell $Q_P$ is erase verified, the reference cell $Q_{R3}$ having the threshold ERS_VT will be used by closing the switch S3. When a bias voltage VG_SENSE is applied to the control gates of both the selected core cell $Q_P$ and the reference cell $Q_{R3}$, the comparator 120 will effectively compare the core cell current ICELL with the reference cell current ERS_IREF. In order for the comparator to output a logic "1" indicative of the selected core cell $Q_P$ being erase-verified, the core cell current ICELL is required to be larger than the reference cell current ERS_IREF.

With reference still to FIG. 3, it can be seen that if the core cell current ICELL is larger than the reference cell current ERS_IREF, then it will be also indeed larger than the reference cell current RD_IREF. Therefore, a selected core cell $Q_P$ that has passed erase verify will likewise cause the comparator to output a logic "1" during the normal Read mode of operation where the reference cell $Q_{R1}$ having the threshold voltage RD_VT will be used by closing the switch S1 in order to produce the corresponding reference current RD_IREF. In other words, the core cell current ICELL will be greater than the reference cell current RD_IREF, which is less than the reference current ERS_IREF, since it is greater than the reference current ERS_IREF.

Based upon a similar analogy, in order to determine whether the selected core cell $Q_P$ is program verified, the reference cell $Q_{R2}$ having the threshold PGM_VT will be used by closing the switch S2. When a bias voltage VG_SENSE is applied to the control gates of both the selected core cell $Q_P$ and the reference cell $Q_{R3}$, the comparator 120 will effectively compare the core cell current ICELL with the reference cell current PGM_IREF. In order for the comparator to output a logic "0" indicative of the selected core cell $Q_P$ being program-verified, the core cell current ICELL is required to be smaller than the reference cell current PGM_IREF.

With reference again to FIG. 3, it can be seen that if the core cell current ICELL is smaller than the reference current PGM_IREF, then it will be also indeed smaller than the reference cell current RD_IREF. Therefore, a selected core cell $Q_P$ that has passed program verify will likewise cause the comparator to output a logic "0" during the normal Read mode of operation where the reference cell $Q_{R1}$ having the threshold voltage RD_VT will be used by closing the switch S1 in order to produce the corresponding reference current RD_IREF. In other words, the core cell ICELL will be smaller than the reference cell current RD_IREF, which is greater than the reference current PGM_IREF, since it is smaller than the reference current PGM_IREF.

In order to determine whether the selected core cell is over-erase-correction verified, the reference cell $Q_{R4}$ having a threshold voltage OEC_VT will be used by closing the switch S4. As will be noted from FIG. 3, in order to produce a current greater than zero when the bias voltage VG_SENSE=0V is being applied during the over-erase-correction verify mode of operation, it is required that the threshold voltage OEC_VT of the reference cell $Q_{R4}$ be set at less than 0V (negatively).

This prior reading circuitry 110 of FIG. 2 suffers from the disadvantages of several drawbacks. Firstly, in conjunction with the performing of the reading, erase verify, program verify, and over-erase-correction verify operations in the array of Flash EEPROM memory cells, there is required the task of trimming (programming) and verifying the threshold voltage of each of the four reference cells $Q_{R1}$–$Q_{R4}$. This trimming procedure involves the cycle of applying a program pulse to the reference cell, program verifying the reference cell, and applying another program pulse which is repeated over and over until the particular reference cell has been successfully trimmed to the different desired threshold voltages (e.g., RD_VT, PGM_VT, ERS_VT, or OEC_VT). Thus, the trimming (setting) process is a very difficult and time-consuming task performed during fabrication of the memory devices which will increase the labor costs.

Secondly, the trimming of the reference cell $Q_{R4}$ to a negative threshold voltage is not desirable or convenient since it will create additional problems, such as requiring a negative supply voltage and/or other special testing equipment. Thirdly, since each reference cell (except for cell $Q_{R1}$) is storing either a positive or negative charge on its floating gate, they are unstable or susceptible to charge loss when there is a disturb. As a result, their threshold voltages will tend to change and thus the associated reference current IREF will be varied. It will be noted that the threshold voltage RD_VT of the reference cell $Q_{R1}$ is typically set near a neutral threshold voltage of UV_VT, which is defined as when there is neither a positive or negative charge added to the floating gate of the cell. Therefore, the closer the threshold voltage of the reference cell is to the neutral threshold voltage UV_VT, the more stable it will be.

Accordingly, there has been discovered by the inventor a new and novel reading circuitry and method for performing program verify, erase verify, and over-erase-correction verify operations on a selected memory core cell in an array of Flash EEPROM memory cells which overcomes the prior art problems. This is accomplished in the present invention by utilizing a single reference cell whose control gate bias voltage is varied to produce different reference current values.

SUMMARY OF THE INVENTION

Accordingly, it is a general object of the present invention to provide an improved reading circuitry and method for performing program verify, erase verify, and over-erase-correction verify operations on a selected memory core cell in an array of flash EEPROM memory core cells which overcomes the disadvantages of the prior art.

It is an object of the present invention to provide an improved reading circuitry and method for performing program verify, erase verify, and over-erase-correction verify operations on a selected memory core cell in an array of flash EEPROM memory core cells so as to reduce the amount of trimming time required during manufacturing.

It is another object of the present invention to provide an improved reading circuitry and method for performing program verify, erase verify, and over-erase-correction verify operations on a selected memory core cell in an array of flash EEPROM memory core cells which includes a single reference cell transistor having a fixed threshold voltage and whose control gate bias voltage is varied to produce different reference current values.

It is still another object of the present invention to provide an improved reading circuitry and method for performing program verify, erase verify, and over-erase-correction verify operations on a selected memory core cell in an array of flash EEPROM memory core cells which includes means for generating a core cell drain current, means for generating reference currents corresponding to predetermined modes of operation, and comparator means for comparing the drain current and the reference currents in order to determine whether the selected core cell has passed program verify, erase verify, and over-erase-correction verify.

In a preferred embodiment of the present invention, there is provided a reading circuit and method for performing program verify, erase verify, and over-erase-correction verify modes of operations on a selected memory core cell in an array of Flash EEPROM memory core cells. A fixed control gate bias voltage is applied to the control gate of a core cell transistor whose state is to be verified for generating a core cell drain current. Varied control gate bias voltages are applied to the control gate of a single reference cell transistor for generating different reference currents corresponding to predetermined modes of operations.

A comparator is used for comparing a sensed voltage corresponding to the core cell drain current and a reference voltage corresponding to one of the different reference currents. The comparator generates an output signal which is at a high logic when the sensed voltage is less than the reference voltage and which is at a low logic level when the sensed voltage is higher than the reference voltage.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENT

A new and novel reading or sensing circuitry and method for performing program verify, erase verify, and over-erase-correction verify operations on a selected memory core cell in an array of Flash EEPROM memory cells is described. In the following description, numerous specific details are set forth, such as specific circuit configurations, components and the like in order to provide a thorough understanding of the present invention. However, it should be apparent to those skilled in the art that the present invention may be practiced without the specific details. In other instances, well-known processes, circuits and control lines, not particularly relevant to the understanding of the operating principles of the present invention, have been purposely omitted for the sake of clarity.

Figure 4:
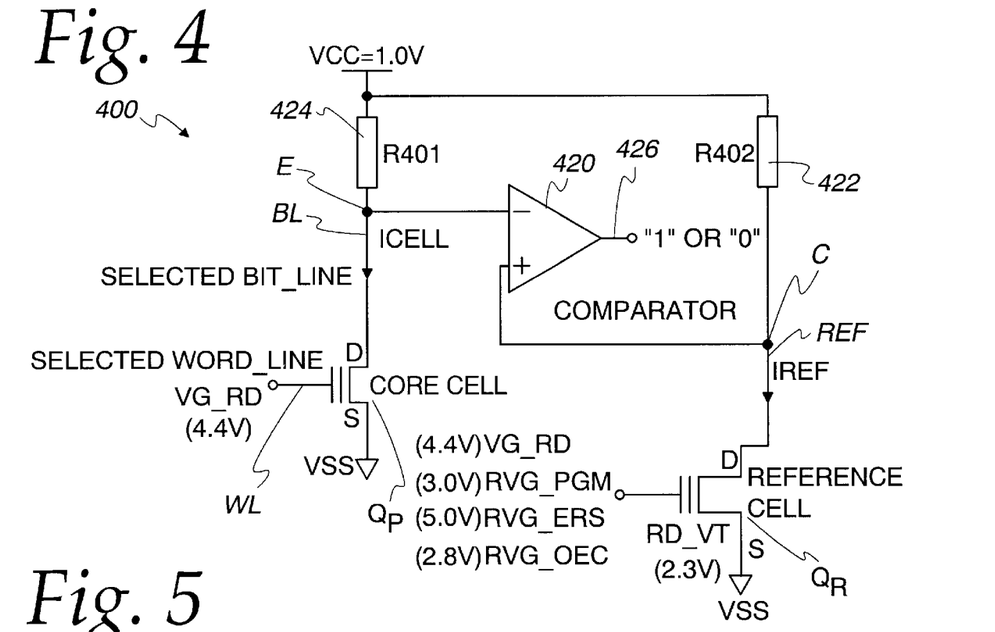
FIG. 4 is a simplified schematic circuit diagram, similar to FIG. 2, but to which the principles of the present invention have been employed.

Referring now in detail to the drawings, there is shown in FIG. 4 a schematic circuit diagram, similar to FIG. 2, of certain portions of a memory circuit device defining a reading or sensing circuitry 400, to which the principles of the present invention have been employed. Unlike the traditional prior art reading technique used in FIGS. 2 and 3, the reading or sensing method of the present invention is capable of determining whether the selected memory core cell has passed program verify, erase verify, and over-erase-correction verify by utilizing a single reference cell. Therefore, the very difficult and time-consuming task of trimming the plurality of reference cells as required in the prior art has been greatly simplified. Consequently, the labor costs associated with the fabrication of the memory devices will be substantially reduced.

The reading circuitry 400 in FIG. 4 of the present invention includes a comparator 420, a reference resistor 422 having a resistive value R402, a sense resistor 424 having a resistance value R401 (R401=R402), a core cell transistor $Q_P$, and a single reference cell transistor $Q_R$. The reference resistor 422 has its one end connected to a supply potential or voltage VCC, which is typically at +1.0 volts, and its other end connected to the non-inverting input of the comparator 420 at node C. The node C is joined to the drain of the reference cell transistor $Q_R$ via a reference bit line REF. One end of the sense resistor 424 is also connected to the supply potential VCC, and the other end is connected to the inverting input of the comparator 420 at node E. The node E is also connected to the drain of the core transistor $Q_P$ via the selected bit line BL.

Unlike the prior art of FIG. 2, the four reference cell transistors $Q_{R1}$–$Q_{R4}$ thereof have been replaced by the single reference cell transistor $Q_R$ having a fixed threshold voltage RD_VT which is trimmed to a value of UV_VT and is thus very stable. Further, it can be seen that the control gates of the core cell transistor $Q_P$ and the reference cell transistor $Q_R$ are not connected together so as to receive the same fixed control gate bias voltage VG_SENSE as in FIG. 2. In particular, only the control gate of the core cell transistor $Q_R$ is connected to a fixed control gate bias voltage VG_RD via the selected word line WL. On the other hand, the control gate of the reference cell transistor $Q_R$ is connected to a varied control gate bias voltage $V_G$.

Figure 5:
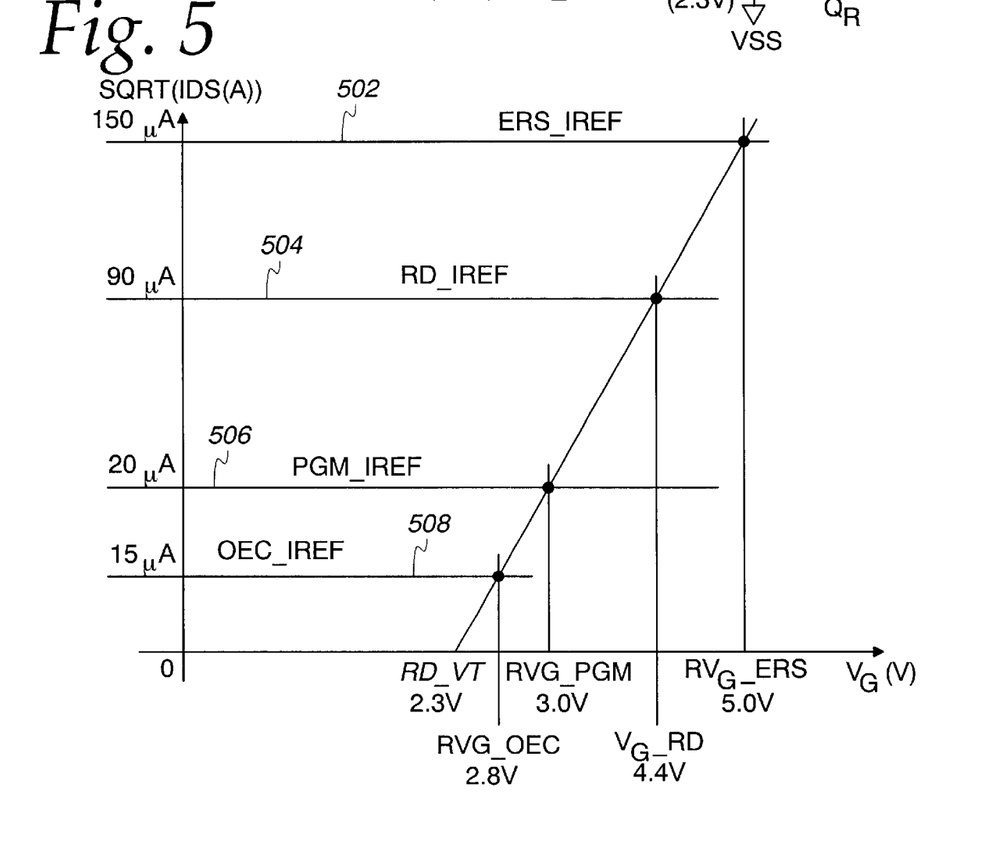
FIG. 5 is a graph of the current $I_{DS}$ of the single reference cell transistor of FIG. 4 having a fixed threshold voltages $V_{TP}$ as a function of different applied control gate bias voltages $V_G$.

The improved reading or sensing method for performing program verify, erase verify, and over-erase-correction verify operations on the core cell transistor $Q_P$ of FIG. 4 of the present invention will now be explained with reference to FIG. 5. Initially, a detailed explanation will first be given with respect to how the four different reference current levels 502, 504, 506, 508 representing constant levels of currents ERS_IREF, RD_IREF, PGM_IREF, and OEC_IREF in FIG. 5 are generated.

These reference current levels are obtained by applying different bias voltages on the control gate of the single reference cell transistor $Q_R$. Initially, it is assumed that the reference cell transistor $Q_R$ has been trimmed (programmed) to have a threshold voltage RD_VT which has a value in the vicinity of the neutral threshold voltage UV_VT, such as +2.3V. Thus, this threshold voltage will be stable. First, with regard to the reference current level 502 designated as ERS_IREF this is generated by applying a bias voltage RVG_ERS (i.e., +5.0V) to the control gate of the reference cell transistor $Q_R$. Second, with regard to the reference current level 504 designated as RD_IREF this is generated by applying a bias voltage VG_RD (i.e., +4.4V) to the control gate of the reference cell transistor $Q_R$.

Similarly, with regard to the reference current level 506 designated as PGM_IREF this is generated by applying a bias voltage RVG_PGM (i.e., +3.0V) to the control gate of the reference cell transistor $Q_R$. Finally, with regard to the reference current level 508 designated as OEC_IREF this is generated by applying a bias voltage RVG_OEC (i.e., +2.8V) to the control gate of the reference cell transistor $Q_R$.

In order to determine whether the selected core cell transistor $Q_P$ is program verified, the reference cell transistor $Q_R$ having the applied control bias voltage RVG_PCM (+3.0V) will be used and the control bias voltage VG_RD (+4.4V) is applied to the control gate of the core cell transistor $Q_P$. As can be seen from FIG. 4, the margin or difference between the reference currents (RD_IREF–PGM_IREF) is provided by the difference of the control gate bias voltages or VG_RD–RVG_PGM (i.e., 4.4V–3.0V). In the prior art reading method of FIG. 2, the difference between the reference currents was obtained by the differences of the threshold voltages or RD_VT–PGM_VT. The present invention has simply converted the prior art threshold voltage margin to a control gate bias margin. Therefore, the relationship can be expressed mathematically in the following equation:

$$VG\_RD-RVG\_PGM=-(RD\_VT-PGM\_VT) \quad (1)$$

In order to determine whether the selected core cell transistor $Q_P$ is erase verified, the same control bias voltage VG_RD is still applied to the control gate of the core cell transistor $Q_P$. However, the control bias voltage RVG_ERS will now be applied to the control gate of the reference cell transistor $Q_R$. Again, the control gate bias margin (FIG. 4) of the present invention can be compared to the threshold voltage margin (FIG. 2) of the prior art. This relationship can be expressed mathematically in the equation below:

$$VG\_RD-RVG\_ERS=-(RD\_VT-ERS\_VT) \quad (2)$$

In order to determine whether the selected core cell transistor $Q_P$ is over-erase-correction verified, the same control bias voltage VG_RD is still applied to the control gate of the core cell transistor $Q_P$. However, the control bias voltage RVG_OEC will now be applied to the control gate of the reference cell transistor $Q_R$. Again, the control gate bias margin (FIG. 4) of the present invention can be compared to the threshold voltage margin (FIG. 2) of the prior art. This relationship can be expressed mathematically in the equation below:

$$VG\_RD-RVG\_OEC=-(RD\_VT-OEC\_VT) \quad (3)$$

Since control gate of the core cell transistor is always grounded during the over-erase-correction mode of operation, VG_RD will be equal to zero and thus the left side of equation (3) can be simplified to: –RVG_OEC.

In operation, a certain amount of core cell drain ICELL will flow through the drain D and source S electrodes of the selected core cell transistor $Q_P$ of FIG. 4 when the fixed bias voltage VG_RD (i.e., +4.4V) is applied to its control gate. This will cause a sensed voltage to be developed at the node E corresponding to the core cell current ICELL. Similarly, a reference current IREF will flow through the drain D and the source S electrodes of the reference cell transistor $Q_R$ when the varied control gate bias voltage $V_G$ is applied to its control gate. The reference current IREF has a value which is equal to one of the reference current levels 502, 504, 506, or 508 (FIG. 5) dependent upon the mode of operation. For example, during the erase verify mode of operation the reference current IREF will set equal to the reference current 502 (ERS_IREF) by adjusting the varied control gate bias voltage to be RVG_ERS (i.e., +5.0V). This will cause a reference voltage to be developed at the node C corresponding to the reference cell current IREF or 150 $\mu$A.

The comparator 420 has its non-inverting input connected to receive the reference voltage at the node C and its inverting input connected to receive the sensed voltage at the node E. The comparator is used to amplify the voltage difference between the sensed voltage and the reference voltage and will generate an output logic signal on lead line 426. If the core cell current ICELL is higher than the reference cell current IREF, then the sensed voltage at the node E will be lower than the reference voltage at the node C. Thus, the output signal of the comparator 420 on the line 426 will be at a high or "1" logic level. On the other hand, if the core cell current ICELL is lower than the reference cell current IREF, then the sensed voltage at the node E will be higher than the reference voltage at the node C. Thus, the output signal of the comparator 420 on the line 426 will be at a low or "0" logic level.

Figure 6:
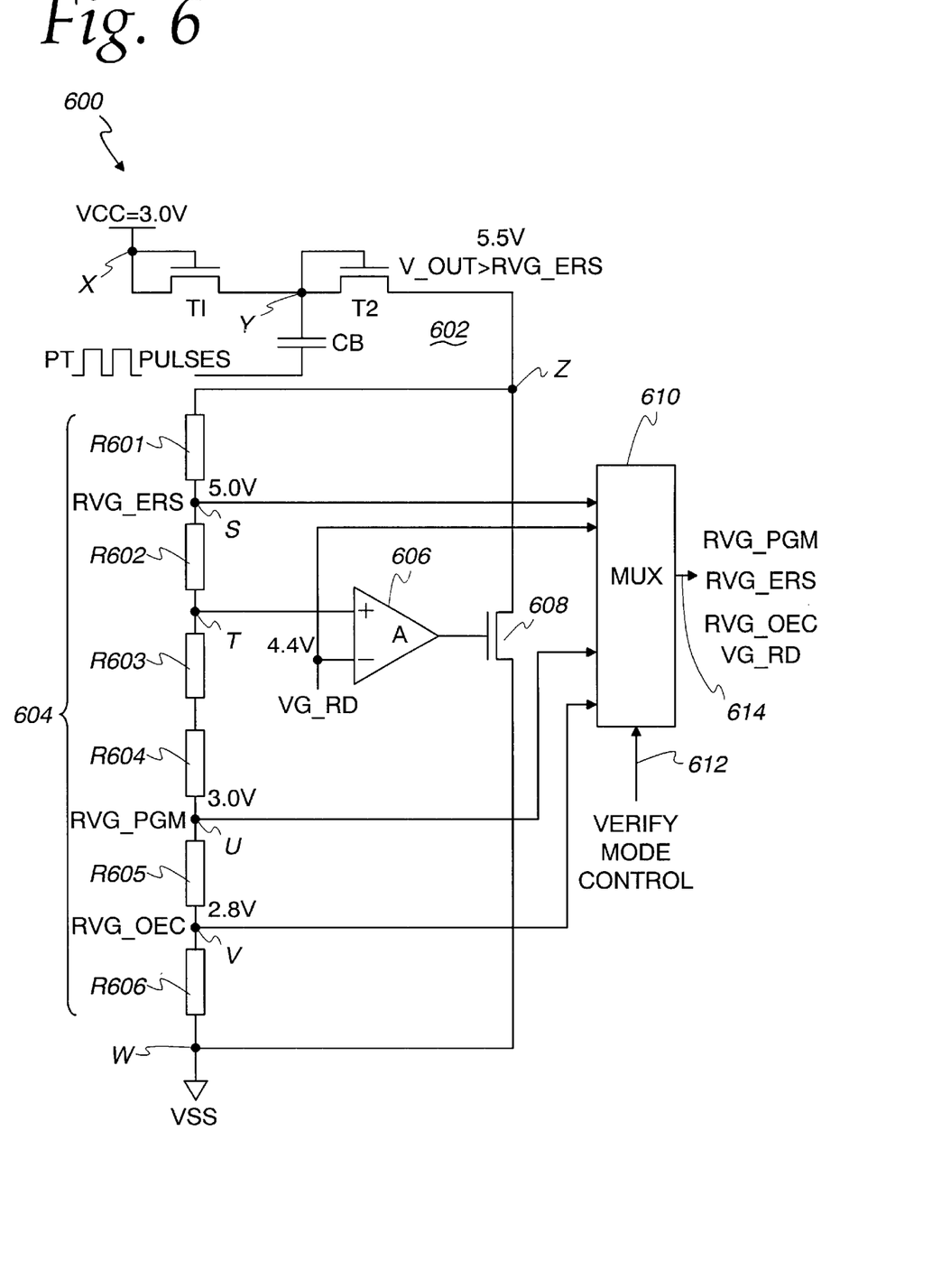
FIG. 6 is a simplified schematic circuit diagram of a bias generator circuit for generating the different control gate bias voltages applied to the gate of the reference cell transistor $Q_R$ of FIG. 5.

In order to produce the varied control gate bias voltages VG_RD, RVG_PGM, RVG_ERS, and RVG_OEC for the different modes of operation, there is illustrated in FIG. 6 a schematic circuit diagram of a reference bias generator circuit 600 which is comprised of a charge pump circuit 602, resistor-divider network 604, an amplifier 606, a switch transistor 608, and a multiplexer 610. The charge pump circuit 602 includes a first pump transistor T1, a second charge pump transistor T2, and a boost capacitor CB. The transistor T1 has its source and gate electrodes connected together and to an upper power supply potential or VCC, which is typically at +3.0V, at node X. The transistor T2 has its source and gate electrodes connected together and to the drain of the transistor T1 at node Y. The capacitor CB has its one end connected also to the node Y and its other end connected to receive a pulse train PT. In response to the potential VCC and the pulse train PT, the charge pump circuit 602 provides an output voltage V_OUT, which is designed to be greater than the largest varied voltage RVG_ERS, such as +5.5 V at node Z.

The resistor-divider network 604 is formed of series-connected resistors R601–R606 which are interconnected between the node Z and a lower power supply potential or VSS (typically at 0V) at node W. The junction of the resistors R601, R602 at node S provides a voltage RVG_

ERS (i.e., +5.0V) which is fed to a first input of the multiplexer 610. The junction of the resistors R602, R603 at node T is designed to provide a potential which is slightly larger than the voltage VG_RD and is connected to the non-inverting input of the amplifier 606. The junction of the resistors R604, R605 at node U provides a voltage RVG_PGM (i.e., +3.0V) which is fed to a second input of the multiplexer 610. The junction of the resistors R605, R606 at node V provides a voltage RVG_OEC (i.e., +2.8V) which is fed to a third input of the multiplexer 610.

The amplifier 606 has its inverting input connected to receive a voltage VG_RD, which is generated from a conventional wordline bias generator (not shown). The voltage VG_RD is also fed to a fourth input of the multiplexer 610. This voltage VG_RD is set, for example, at +4.4V during the program verify and erase verify modes of operation and is set at 0V during the over-erase-correction verify mode of operation. The switch transistor 608 has its gate connected to the output of the amplifier 606, its drain connected to the node Z, and its source connected to the node W. The multiplexer 610 has a fifth input on line 612 for receiving a verify mode control signal and generates a varied control gate bias voltage VG on output line 614. The varied bias voltage VG will be set to either RVG_PGM, RVG_ERS, RVG_OEC, or VG_RD in response to the verify mode control signal.

As can be seen, the reference bias generator circuit 600 generates all of the gate bias voltages for the different modes of operations. The amplifier 606 is used to reference all of the generated gated bias voltages with respect to the read bias voltage VG_RD so that the control gate bias differences are fixed. In other words, the control gate bias margins used for the different verify modes are fixed. If the voltage VG_RD at the inverting input becomes smaller, the voltage at the node T will then be larger with respect to the voltage VG_RD so as to cause the output of the amplifier 606 to become larger. This will, in turn, cause the switch transistor 608 to be rendered more conductive which will pull down the potential at the node Z. As a result, all of the gate bias voltages at the respective nodes S, T, U and V will be lowered proportionally so as to reduce the difference between the voltage at the node T and the voltage VG_RD until they become very close to the same potential.

In operation, during the normal read mode, the voltage VG_RD is applied to both control gates of the core cell transistor and the reference cell transistor. In the other modes of operations, the voltage VG_RD is applied only to the control gate of the core cell transistor, and the output of the multiplexer 610 on the line 614 applied to the control gate of the reference cell transistor will at either RVG_PGM, RVG_ERS, or RVG_OEC dependent upon the particular verify mode.

Figure 7:
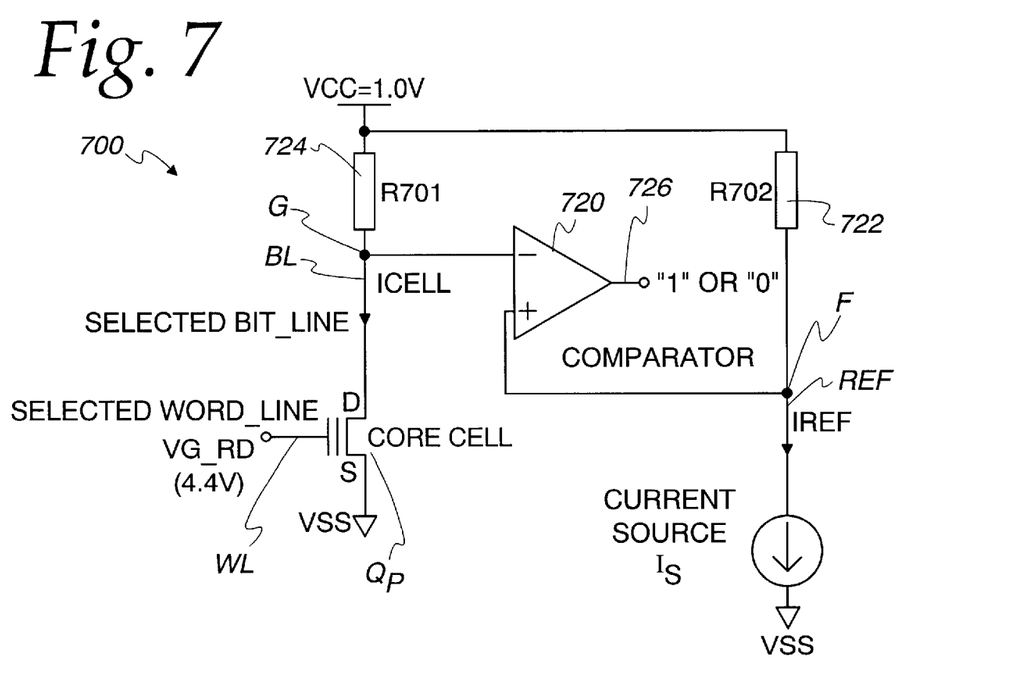
FIG. 7 is a simplified schematic circuit diagram, similar to FIG. 4, illustrating a second embodiment of the present invention.

In FIG. 7, there is shown a schematic circuit diagram, similar to FIG. 4, of certain portions of a memory circuit device defining a reading or sensing circuitry 700, illustrating a second embodiment of the present invention. The reading or sensing method in the second embodiment of the present invention is quite similar to FIG. 4, except that the single reference cell $Q_R$ thereof has been simply replaced with a current source $I_S$.

The reading circuitry 700 in FIG. 7 for the second embodiment of the present invention includes a comparator 520, a reference resistor 522 having a resistive value R502, a sense resistor 524 having a resistance value R501 (R501=R502), a core cell transistor $Q_P$, and a current source $I_S$. The reference resistor 522 has its one end connected to a supply potential or voltage VCC, which is typically at +1.0 volts, and its other end connected to the non-inverting input of the comparator 520 at node F. The node F is joined to one end of the current source $I_S$. via a reference bit line REF. The other end of the current source is connected to a ground potential VSS. One end of the sense resistor 524 is also connected to the supply potential VCC, and the other end thereof is connected to the inverting input of the comparator 520 at node G. The node G is also connected to the drain of the core transistor $Q_P$ via the selected bit line BL.

The four different reference current levels 502, 504, 506, 508 representing constant levels of currents ERS_IREF, RD_IREF, PGM_IREF, and OEC_IREF in FIG. 5 correspond to the current values of 150 $\mu$A, 90 $\mu$A, 20 $\mu$A and 15 $\mu$A, respectively. These reference current values are generated by a current source circuit 800 of FIG. 8, which will be explained more fully hereinbelow.

In operation, a certain amount of core cell drain ICELL will flow through the drain D and source S electrodes of the selected core cell transistor $Q_P$ of FIG. 7 when the fixed bias voltage VG_RD (i.e., +4.4V) is applied to its control gate. This will cause a sensed voltage to be developed at the node G corresponding to the core cell current ICELL. Similarly, a reference current IREF will flow through the current source $I_S$. The reference current IREF has a value which is again equal to one of the reference current levels 502, 504, 506, or 508 (FIG. 5) dependent upon the mode of operation. For example, during the erase verify mode of operation the reference cell current IREF will set equal to the reference current 502 (ERS_IREF) which has a value of 150 $\mu$A.

The comparator 720 has its non-inverting input connected to receive the reference voltage at the node F and its inverting input connected to receive the sensed voltage at the node G. The comparator is used to compare the core cell current ICELL with the reference cell IREF and the reference voltage and will generate an output logic signal on lead line 726. If the core cell current ICELL is higher than the reference cell current IREF, then the output signal of the comparator 720 on the line 726 will be at a high or "1" logic level. On the other hand, if the core cell current ICELL is lower than the reference cell current IREF, then the output signal of the comparator 720 on the line 726 will be at a low or "0" logic level.

Figure 8:
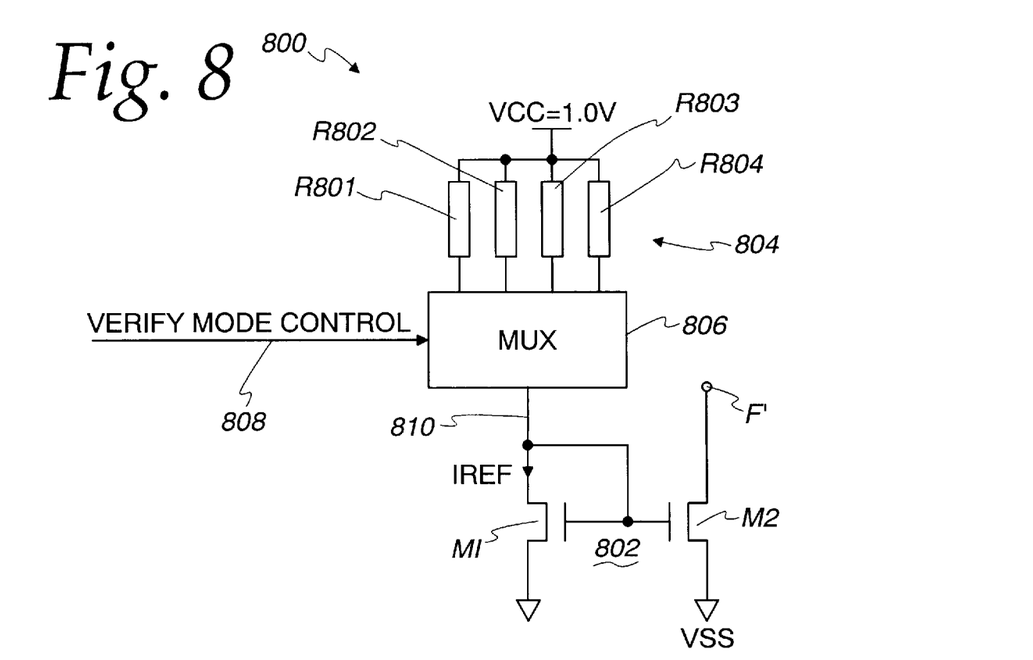
FIG. 8 is a simplified schematic circuit diagram of a current source circuit for generating the different reference currents for the current source $I_s$ of FIG. 7.

In order to produce the four different reference current levels ERS_IREF, RD_IREF, PGM_IREF, AND OEC_IREF in FIG. 5 for the different modes of operation, there is illustrated in FIG. 8 a schematic circuit diagram of a current source circuit 800 which is comprised of a current mirror arrangement 802, a parallel-connected resistor network 804, and a multiplexer 806. The current mirror arrangement 802 includes a first mirror N-channel transistor M1 and a second mirror N-channel transistor M2. The first mirror transistor M1 has its gate and drain electrodes connected together and tot he gate electrode of the second mirror transistor M2. The source electrodes of the transistors M1, M2 are connected to a ground potential VSS. The drain electrode of the transistor M2 at node F' is connected to the node F of FIG. 7.

The parallel-connected resistor network 804 is formed of four resistors R801–R804 which are connected in parallel between an upper power supply potential or VCC (typically at +1.0V) and the multiplexer 806. One end of each of the resistors R801–R804 is connected to the power supply potential. The other end of the resistor R801 is fed to a first input of the multiplexer 806. The other end of the resistor R802 is fed to a second input of the multiplexer 806. The other end of the resistor R803 is fed to a third input of the multiplexer 806. The other end of the resistor R804 is fed to a fourth input of the multiplexer 806.

The value of the resistor R801 is selected and preset so as to cause a current of 150 µA corresponding to the erase verify mode to flow when it is connected to the multiplexer 806. The value of the resistor R802 is selected and pre-set so as to cause a current of 90 µA corresponding to the read mode to flow when it is connected to the multiplexer 806. The value of the resistor R803 is selected and pre-set so as to cause a current of 20 µA corresponding to the program verify mode to flow when it is connected to the multiplexer 806. The value of the resistor R804 is selected and pre-set so as to cause a current of 15 µA corresponding to the over-erase-correction verify mode to flow when it is connected to the multiplexer 806.

The multiplexer 806 has a fifth input on line 808 for receiving a verify mode control signal. The output of the multiplexer 806 on line 810 provides in response to the control signal the reference cell current IREF having a value corresponding to one of the reference current levels of 150 µA, 90 µA, 20 µA or 15 µA (FIG. 5) dependent upon the mode of operation. For example, the reference cell current IREF will be set to 150 µA by selecting the resistor R801.

As will be noted, since this second embodiment of the present invention does not use a floating gate transistor but instead N-channel transistors M1, M2 for the reference cell the need for trimming of reference cells has now been completely eliminated. Further, due to the use of resistors R801–R804 whose values can be easily set, the reading circuitry 700 of FIG. 7 of the present invention is very stable, reliable and simple to implement.

From the foregoing detailed description, it can thus be seen that the present invention provides an improved reading circuitry and method for performing program verify, erase verify, and over-erase-correction verify operations on a selected memory core cell in an array of Flash EEPROM memory cells so to reduce trimming time during manufacturing. This is achieved by the provision of a single reference cell having a fixed threshold voltage and whose control gate bias voltage is varied to produce different reference current levels. In addition, the threshold voltage of the reference cell is programmed to be near a neutral threshold voltage so as to be very stable.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A reading method for performing program verify, erase verify, and over-erase-correction verify modes of operations on a selected memory core cell in an array of Flash EEPROM memory core cells, said method comprising the steps of:

applying a fixed control gate bias voltage to the control gate of a core cell transistor whose state is to be verified for generating a core cell drain current;

charge pumping a power supply potential to generate an output voltage which is higher than the power supply potential;

connecting the output voltage to a resistor-divider network;

generating from the resistor-network a first one of the varied control gate bias voltages which corresponds to the program verify mode of operation, a second one of the varied control gate bias voltages which corresponds to the erase verify mode of operation, and a third one of the varied control gate bias voltages which corresponds to the over-erase-correction mode of operation;

applying from a multiplexer either the first one, the second one, or the third one of the varied control gate bias voltages to the control gate of a single reference cell transistor for generating different reference currents corresponding to predetermined modes of operations; and comparing a sensed voltage corresponding to the core cell drain current and a references voltage corresponding to one of said different reference currents and generating an output signal which is at a high logic when said sensed voltage is less than said reference voltage and which is at a low logic level when said sensed voltage is higher than said reference voltage.

2. The reading method for performing program verify, erase verify, and over-erase-correction modes of operations as claimed in claim 1, wherein said reference cell transistor has its threshold voltage programmed to be substantially equal to a neutral threshold voltage so as to be very stable.

3. The reading method for performing program verify, erase verify, and over-erase-correction modes of operations as claimed in claim 1, wherein the step of comparing includes receiving sensed voltage on an inverting input of a high gain amplifier, receiving said reference voltage on a non-inverting input of the high gain amplifier, and generating said output signal on an output of the high gain amplifier.

4. A reading circuit for performing program verify, erase verify, and over-erase-correction verify modes of operations on a selected memory core cell in an array of Flash EEPROM memory core cells, said circuit comprising:

means for generating a fixed control gate bias voltage to be applied to the control gate of a core cell transistor whose state is to be verified for generating a core cell drain current;

means for generating varied control gate bias voltages to be applied to the control gate of a single reference cell transistor for generating different reference currents corresponding to predetermined modes of operations;

said means for generating the varied control gate bias voltages including reference bias generator means formed of a charge pump circuit generating an output voltage, a resistor-divider network having its one end connected to the output voltage and its other end connected to a ground potential, and a multiplexer;

said resistor-divider network providing a first one of the varied control gate bias voltages which corresponds to the program verify mode of operation, a second one of the varied control gate bias voltages which corresponds to the erase verify mode of operation, and a third one of the varied control gate bias voltages which corresponds to the over-erase-correction mode of operation;

said multiplexer being responsive to a verify mode control signal for generating either the first one, the second one, or the third one of said varied control gate bias voltages; and means for comparing a sensed voltage corresponding to the core cell drain current and a reference voltage corresponding to one of said different reference currents and for generating an output signal which is at a high logic when said sensed voltage is less than said reference voltage and which is at a low logic level when said sensed voltage is higher than said reference voltage.

5. The reading circuit for performing program verify, erase verify, and over-erase-correction modes of operations as claimed in claim 4, wherein said reference cell transistor has its threshold voltage programmed to be substantially equal to a neutral threshold voltage so as to be very stable.

6. The reading circuit for performing program verify, erase verify, and over-erase-correction modes of operations as claimed in claim 4, wherein said comparing means includes a high gain amplifier having an inverting input for receiving said sensed voltage, a non-inverting input for receiving said reference voltage, and an output for providing said output signal.

7. A reading circuit for performing program verify, erase verify, and over-erase-correction verify modes of operations on a selected memory core cell in an array of Flash EEPROM memory core cells, said circuit comprising:

means for generating a fixed control gate bias voltage to be applied to the control gate of a core cell transistor whose state is to be verified for generating a core cell drain current;

current source circuit means for generating different reference currents corresponding to predetermined modes of operations;

said current source circuit means for generating the different reference currents including a current mirror arrangement formed of a first N-channel transistor and a second N-channel transistor, a parallel-connected resistor network formed of a plurality of resistors whose values are pre-set so as to be very stable, and a multiplexer;

one end of each of the plurality of resistors being connected to a power supply potential and its other end being connected to a respective input of said multiplexer;

said multiplexer having its output connected to said current mirror arrangement for generating either a first one of said different reference currents which corresponds to the program verify mode of operation, a second one of said different reference currents which corresponds to the erase mode of operation, or a third one of said different reference currents which corresponds to the over-erase-correction operation; and comparing the core cell drain current and one of said different reference currents and generating an output signal which is at a high logic when the core cell drain current is higher than said one of said different reference currents and which is at a low logic level when the core cell drain current is lower than said one of said different reference currents.

* * * * *

UNITED STATES PATENT AND TRADEMARK OFFICE
CERTIFICATE OF CORRECTION

PATENT NO.    : 6,490,203 B1                                                        Page 1 of 1
DATED         : December 3, 2002
INVENTOR(S)   : Yuan Tang It is certified that error appears in the above-identified patent and that said Letters Patent is hereby corrected as shown below:

<u>Title page,</u>
Item [73], Assignee, change "EDN Silicon Devices, Inc." to -- EON Silicon Devices, Inc. --

Signed and Sealed this

Third Day of June, 2003

JAMES E. ROGAN
*Director of the United States Patent and Trademark Office*